(12) United States Patent
Yashiro et al.

(10) Patent No.: US 12,356,545 B2
(45) Date of Patent: *Jul. 8, 2025

(54) HIGH DURABILITY SOLDER TERMINALS

(71) Applicant: SKYWORKS SOLUTIONS, INC., Irvine, CA (US)

(72) Inventors: Yuji Yashiro, Kizugawa (JP); Toru Yamaji, Nagaokakyou (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 399 days.

This patent is subject to a terminal disclaimer.

(21) Appl. No.: 17/806,296

(22) Filed: Jun. 10, 2022

(65) Prior Publication Data

US 2022/0304151 A1 Sep. 22, 2022

Related U.S. Application Data

(63) Continuation of application No. 16/686,416, filed on Nov. 18, 2019, now Pat. No. 11,470,719.

(60) Provisional application No. 62/769,143, filed on Nov. 19, 2018.

(51) Int. Cl.
*H05K 1/11* (2006.01)
*H03H 9/54* (2006.01)

(52) U.S. Cl.
CPC ............. *H05K 1/111* (2013.01); *H03H 9/547* (2013.01)

(58) Field of Classification Search
CPC ............. H30H 9/02; H30H 9/54; H05K 1/111
See application file for complete search history.

(56) References Cited

U.S. PATENT DOCUMENTS

| | | | |
|---|---|---|---|
| 5,558,271 A | 9/1996 | Rostoker et al. | |
| 7,045,902 B2 | 5/2006 | Liu | |
| 7,298,629 B2 * | 11/2007 | Nakajima | H05K 1/111 174/262 |
| 7,696,594 B2 * | 4/2010 | Davis, Jr. | H05K 3/3485 257/459 |
| 8,047,421 B2 * | 11/2011 | Sri-Jayantha | H01L 23/49816 228/180.5 |
| 9,548,280 B2 | 1/2017 | Sarihan et al. | |
| 9,666,510 B2 * | 5/2017 | Liu | H01L 23/49548 |
| 10,192,840 B2 | 1/2019 | Cai et al. | |
| 10,582,615 B2 * | 3/2020 | Noguchi | H01L 23/49838 |
| 10,843,284 B2 | 11/2020 | Edlinger | |
| 11,450,635 B2 * | 9/2022 | Hsu | H01L 24/06 |
| 11,470,719 B2 * | 10/2022 | Yashiro | H03H 9/1064 |
| 2002/0000895 A1 | 1/2002 | Takahashi et al. | |
| 2005/0026647 A1 | 2/2005 | Li et al. | |

(Continued)

FOREIGN PATENT DOCUMENTS

JP S61177762 A 8/1986

OTHER PUBLICATIONS

Search Report from corresponding GB Application No. 1916766.7 dated Jul. 30, 2020, In parent U.S. Appl. No. 16/686,416.

*Primary Examiner* — Andrea Lindgren Baltzell
*Assistant Examiner* — Alan Wong
(74) *Attorney, Agent, or Firm* — Lando & Anastasi, LLP

(57) ABSTRACT

An electronic device package includes a lower surface for conducting electronic signals, a first solder bond pad having a first size disposed on the lower surface, and a plurality of second solder bond pads having second sizes smaller than the first size disposed on the lower surface and surrounding the first solder bond pad.

18 Claims, 13 Drawing Sheets

(56) References Cited

U.S. PATENT DOCUMENTS

| | | |
|---|---|---|
| 2011/0181372 A1 | 7/2011 | Fujita |
| 2013/0015592 A1 | 1/2013 | Kelkar et al. |
| 2017/0012603 A1 | 1/2017 | Reisner et al. |
| 2018/0287588 A1* | 10/2018 | Takeshita ............... H03H 9/145 |
| 2020/0163212 A1 | 5/2020 | Yashiro et al. |

* cited by examiner

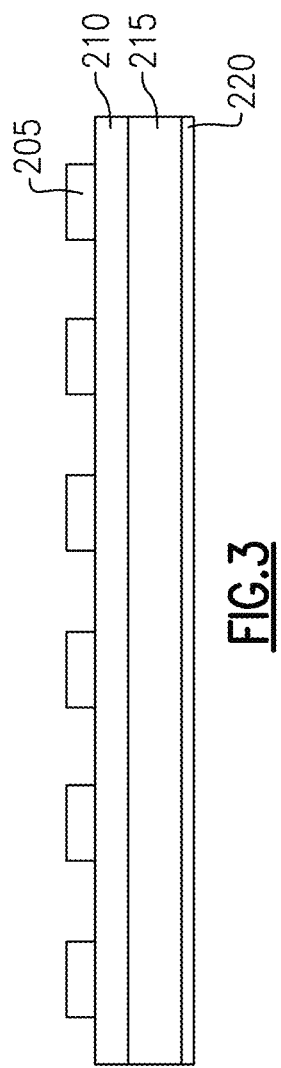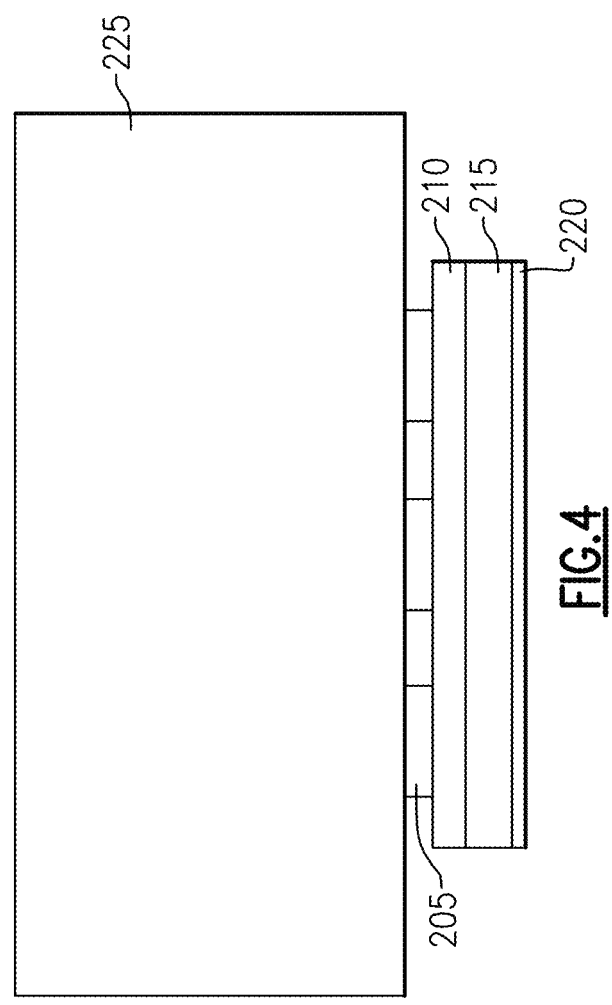

HIGH DURABILITY SOLDER TERMINALS

CROSS-REFERENCE TO RELATED APPLICATIONS

This application claims priority under 35 U.S.C. § 120 as a continuation of U.S. patent application Ser. No. 16/686,416, titled "HIGH DURABILITY SOLDER TERMINALS," filed Nov. 18, 2019 which claims priority under 35 U.S.C. § 119(e) to U.S. Provisional Patent Application Ser. No. 62/769,143 titled "HIGH DURABILITY SOLDER TERMINALS," filed Nov. 19, 2018 each of which being incorporated herein in its entirety for all purposes.

BACKGROUND

Technical Field

Embodiments of this disclosure relate to arrangements of solder terminals on electronic devices.

Description of Related Technology

Acoustic wave devices, for example, surface acoustic wave (SAW) and bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer. Acoustic wave devices and filters may be mounted in packages that include solder terminals for electrically and physically connecting the packages to a substrate, for example, a printed circuit board.

SUMMARY

In accordance with one aspect, there is provided an electronic device package. The electronic device package comprises a lower surface for conducting electronic signals, a first solder bond pad having a first size disposed on the lower surface, and a plurality of second solder bond pads having second sizes smaller than the first size disposed on the lower surface and surrounding the first solder bond pad.

In some embodiments, a length of the first solder bond pad is greater than lengths of each of the plurality of second solder pads.

In some embodiments, the plurality of second solder bond pads includes four corner solder bond pads disposed proximate respective corners of the lower surface of the electronic device package. The four corner solder bond pads may each have three rounded corners and one squared corner. The squared corner of each of the four corner bond pads may be on a side of each of the four corner bond pads facing away from the first solder bond pad in a lengthwise direction and facing toward the first solder bond pad in a widthwise direction.

In some embodiments, the plurality of second solder bond pads includes four third bond pads, each of the four third bond pads disposed adjacent a respective one of the four corner bond pads in a lengthwise direction on the lower surface of the electronic device package. The four third bond pads may each have three squared corners and one rounded corner. The rounded corner of each of the four third bond pads may face away from the first solder bond pad and toward the respective corner bond pad to which each respective third bond pad is disposed adjacent to. Each of the plurality of second bond pads other than the four corner bond pads and four third bond pads may have four squared corners.

In some embodiments, the first solder bond pad has four squared corners. The first solder bond pad may be rectangular.

In some embodiments, the first solder bond pad is disposed centrally on the lower surface of the electronic device package.

In some embodiments, the first solder bond pad is a ground bond pad.

In accordance with another aspect, there is provided an electronic device. The electronic device comprises a plurality of acoustic wave resonators disposed in an electronic device package. The electronic device package includes a lower surface for conducting electronic signals, a first solder bond pad having a first size disposed on the lower surface, and a plurality of second solder bond pads having second sizes smaller than the first size disposed on the lower surface and surrounding the first solder bond pad.

In accordance with another aspect, there is provided a radio frequency filter. The radio frequency filter comprises a plurality of acoustic wave resonators forming the radio frequency filter and disposed in an electronic device package. The electronic device package includes a lower surface for conducting electronic signals, a first solder bond pad having a first size disposed on the lower surface, and a plurality of second solder bond pads having second sizes smaller than the first size disposed on the lower surface and surrounding the first solder bond pad.

In accordance with another aspect, there is provided an electronics module. The electronics module comprises a radio frequency filter including a plurality of acoustic wave resonators disposed in an electronic device package. The electronic device package includes a lower surface for conducting electronic signals, a first solder bond pad having a first size disposed on the lower surface, and a plurality of second solder bond pads having second sizes smaller than the first size disposed on the lower surface and surrounding the first solder bond pad.

In accordance with another aspect, there is provided an electronic device. The electronic device comprises an electronics module including a radio frequency filter formed of a plurality of acoustic wave resonators disposed in an electronic device package. The electronic device package includes a lower surface for conducting electronic signals, a first solder bond pad having a first size disposed on the lower surface, and a plurality of second solder bond pads having second sizes smaller than the first size disposed on the lower surface and surrounding the first solder bond pad.

BRIEF DESCRIPTION OF THE DRAWINGS

Embodiments of this disclosure will now be described, by way of non-limiting example, with reference to the accompanying drawings.

FIG. 3 illustrates the thicknesses of various layers in a simulated device used in simulations to predict accumulated strain in bond pads of the simulated device;

FIG. 4 illustrates the simulated device of FIG. 3 bonded to a simulated circuit board;

DETAILED DESCRIPTION OF CERTAIN EMBODIMENTS

Figure 1:
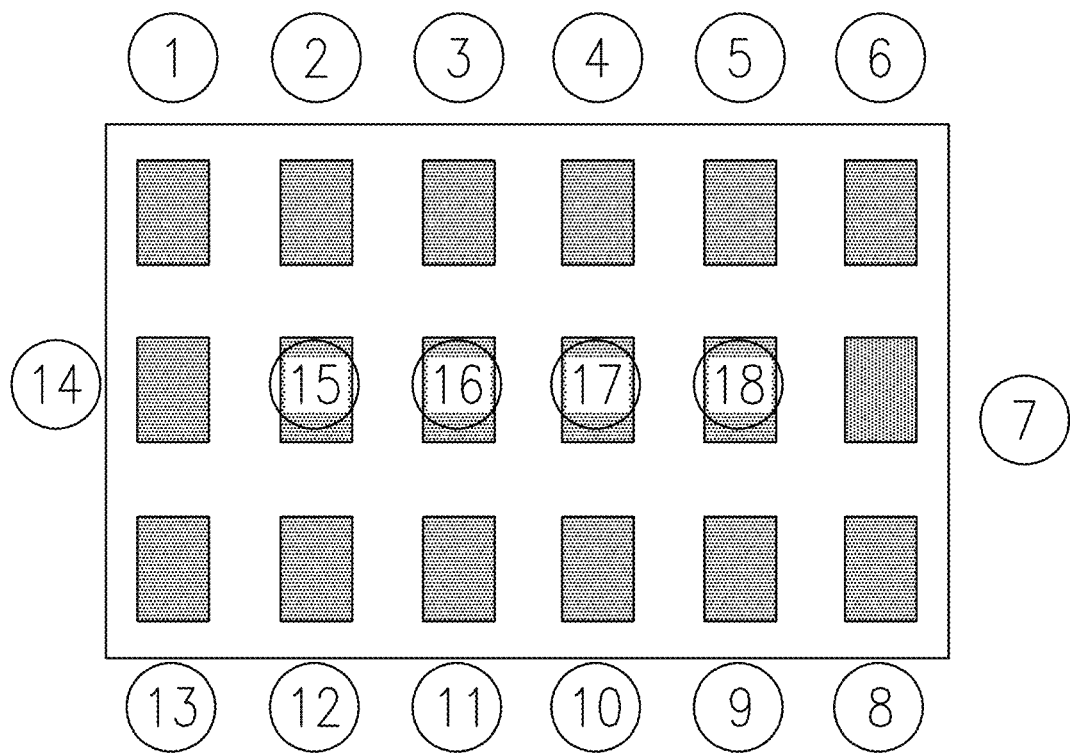
FIG. 1 is an example of a configuration of bond pads on a co-packaged surface acoustic wave (SAW) device.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Single or multiple surface acoustic wave (SAW) devices may be mounted in a package which provides for handling of the devices and for physical and electrical connection of the devices to additional circuitry of an electronic device module or electronic device. Electrical terminals in the form of solder pads may be provided on a surface of a device package for physically and electrically connecting the packaged device to a substrate, for example, a printed circuit board in an electronic device module or electronic device. Thermal stress may be created in the solder joints of a packaged device that is bonded to a printed circuit board due to temperature cycles caused by changes in environmental temperature, self-heating of the packaged device during operation, and due to the difference in expansion and contraction between the printed circuit board and the device package, which often have different thermal expansion coefficients. As a result, the solder joints may suffer from fatigue cracks that may result in failure of the solder joint connections. If multiple SAW devices are enclosed (co-packaged) within a single package for inclusion in devices operating on multiple bandwidths, the size of the single package increases and the differences in expansion and contraction between the package and printed circuit board become more significant during temperature cycles, potentially resulting in decreased product lifetime.

Although specific reference is made herein to acoustic wave devices, it is to be understood that the disclosed embodiments may be utilized with any type of integrated circuit bonded to a substrate.

An arrangement of solder terminals on the bottom of a package for one example of a co-packaged SAW device is illustrated in FIG. 1. In the illustrated solder pad configuration solder pads 1, 2, 5, 6, 8, 9, 12, 13, and 15-18 are each intended to be connected to ground. Pads 3 and 4 are connected to different receiver units in the co-packaged device, pads 10 and 11 and connected to different transmitter units in the co-packaged device, and pads 7 and 14 are for connection to different antennas for the different SAW filters in the co-packaged device.

Figure 2A:
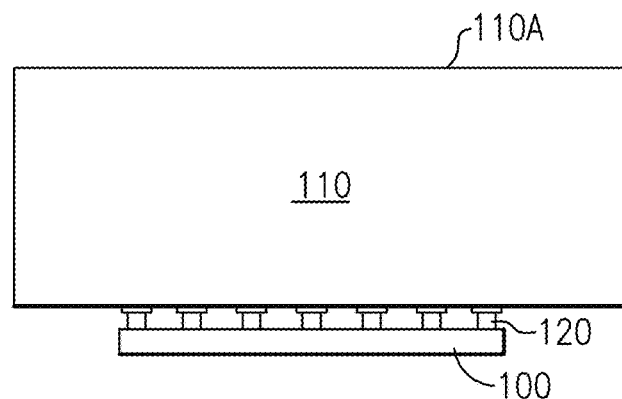
FIG. 2A illustrates a condition of bond pads of a device bonded to a circuit board at ambient temperature.
Figure 2B:
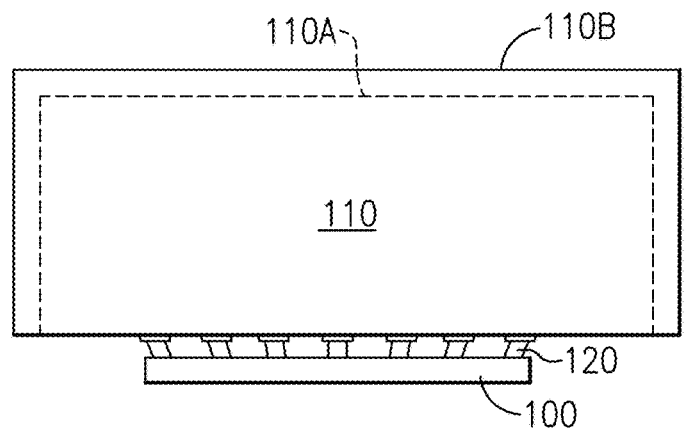
FIG. 2B illustrates a condition of bond pads of a device bonded to a circuit board at an elevated temperature.
Figure 2C:
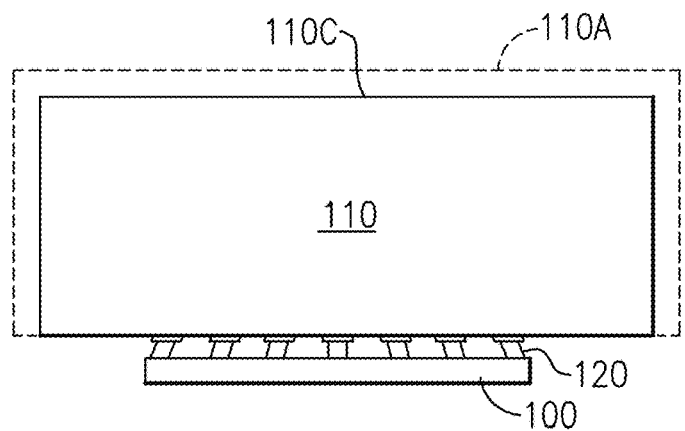
FIG. 2C illustrates a condition of bond pads of a device bonded to a circuit board at a reduced temperature.

FIGS. 2A-2C illustrate stresses that may occur in solder joints of an electronic device package at high temperatures and at low temperatures. FIG. 2A illustrates an electronic device package, indicated at 100, bonded to a circuit board, indicated at 110, by a plurality of solder pads, collectively indicated at 120 at room temperature. FIG. 2B illustrates the same electronic device package 100 and circuit board 110 at a high temperature and FIG. 2C illustrates the same electronic device package 100 and circuit board 110 at a reduced temperature below room temperature. In the example illustrated in FIGS. 2A-2C, the circuit board 110 has a greater temperature coefficient of expansion than the device package 100. The outline 110A represents the size of the circuit board 110 at room temperature, 110B represents the size of the circuit board at the increased temperature, and 110C represents the size of the circuit board at the reduced temperature. It can be seen that at both the high temperature condition and the low temperature condition the solder joints 120 are stressed due to the difference in thermal expansion between the device package 100 and circuit board 110. After repeated cycles of heating and cooling, inelastic strain (fatigue) may accumulate in the solder joints 120. The accumulated fatigue may lead to breakage of one or more of the solder joints, resulting in failure of the connection between the device package 100 and circuit board 110.

The number of temperature cycles prior to fatigue failure of a solder joint typically follows the Coffin-Manson rule:

$$N = C\Delta\varepsilon^n$$

N: lifetime (unit: cycle)

$\Delta\varepsilon$: corresponding inelastic strain amplitude (unit: %) coefficient C: lifetime when the corresponding inelastic strain amplitude is 1%. >0 n: parameter representing degree of influence of the corresponding inelastic strain amplitude. <0 where C and n are coefficients inherent to the materials (device, solder, circuit board). Estimating Δε using a finite element method simulation and the like may enable the lifetime versus temperature cycles to be discussed in terms of values of Δε and, if the coefficients are known, the lifetime derived from the inelastic strain can be estimated.

To reduce the likelihood of stress fractures of solder joints in device packages bonded to circuit boards, modifications may be made to the solder pad design illustrated in FIG. 1. These modifications may include combining ground terminals near the center of the package into a single unified larger ground terminal. The single unified larger ground terminal may have a greater surface area than the uncombined ground terminals and may thus suppress displacement of the package. Additionally, corners of the solder terminals where greater inelastic strain may accumulate may be rounded to prevent stress concentration and the strain accumulation, while right angles may be formed at the corners of solder terminals where strain is not expected to accumulate to obtain a greater area for solder bonds and prevent the displacement of the device package on the circuit board due to the temperature cycles.

Figure 5:
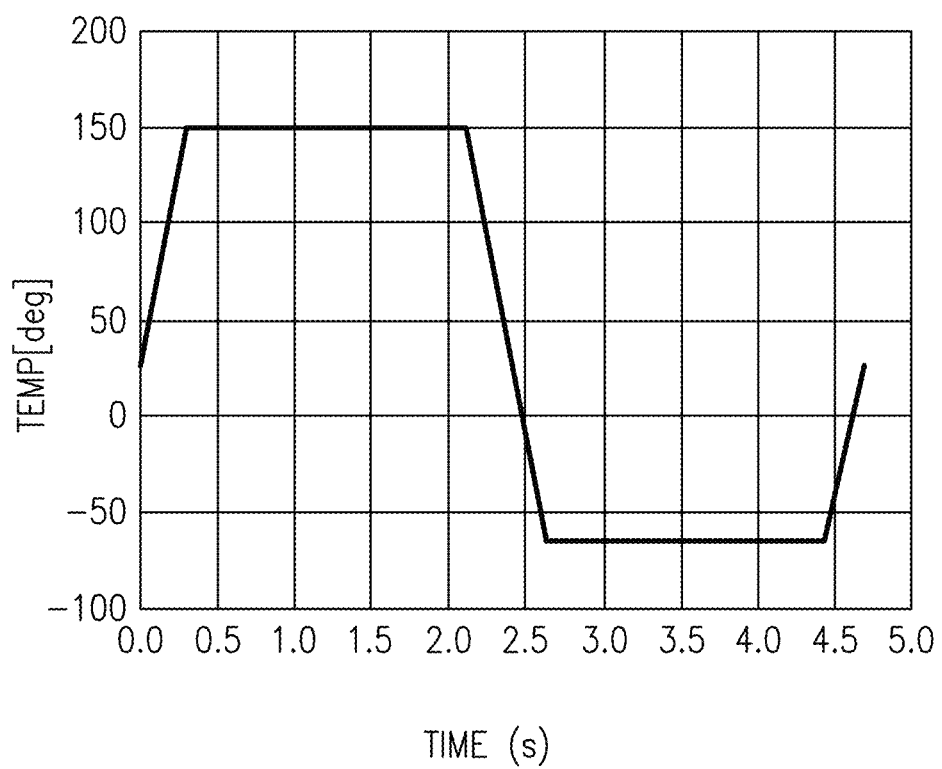
FIG. 5 illustrates a simulated temperature cycle used in the simulations to predict the accumulated strain in the bond pads of the simulated device of FIG. 3.

To investigate the strain that accumulated in solder pads in device packages having different solder pad configurations, a finite element simulation method was performed in which a simulated package having SnAgCu solder pads 205 with heights of 60 μm disposed on an 80 μm thick layer of encapsulation resin 210, which was in turn disposed on a 130 μm thick LiNbO$_3$ substrate 215 with a backside 25 μm thick marking film 220 as illustrated in FIG. 3 bonded to a 1 mm thick glass epoxy circuit board substrate 225 as illustrated in FIG. 4 was subjected to 1,000 temperature cycles as illustrated in FIG. 5 wherein a temperature of 150° C. was maintained for 15 minutes followed by a temperature of −65° C. maintained for 15 minutes.

Figure 6A:
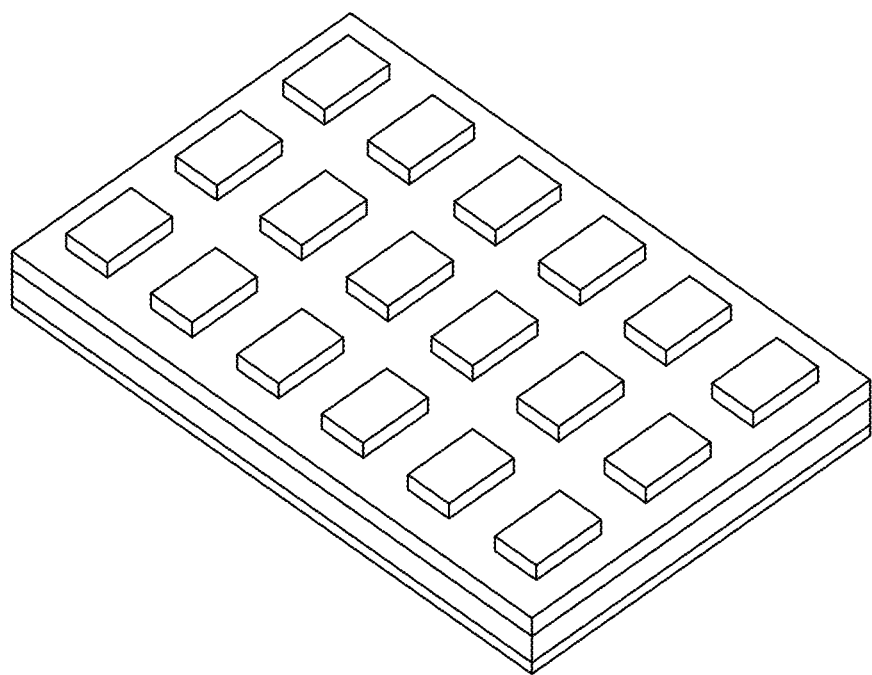
FIG. 6A illustrates a device package having a first example bond pad configuration.
Figure 6B:
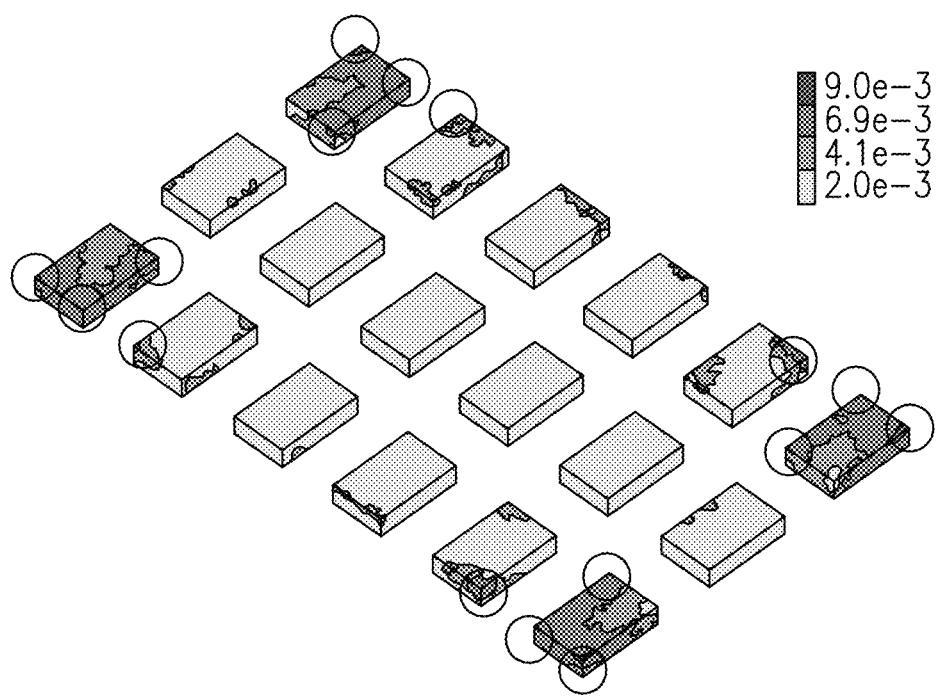
FIG. 6B illustrates the accumulated strain in the bond pads of the device of FIG. 6A predicted by simulation.

A first simulation was performed on a simulated package having a conventional arrangement of solder pads as illustrated in FIG. 6A and referred to herein as Example 1. The individual pads had length and width dimensions of about 20 μm by 30 μm. The resultant inelastic strain accumulation in the solder pads is illustrated in FIG. 6B, wherein circled areas are locations where particularly large values of inelastic strain developed. A maximum inelastic strain value of $8.520 \times 10^{-3}$ was observed.

Figure 7A:
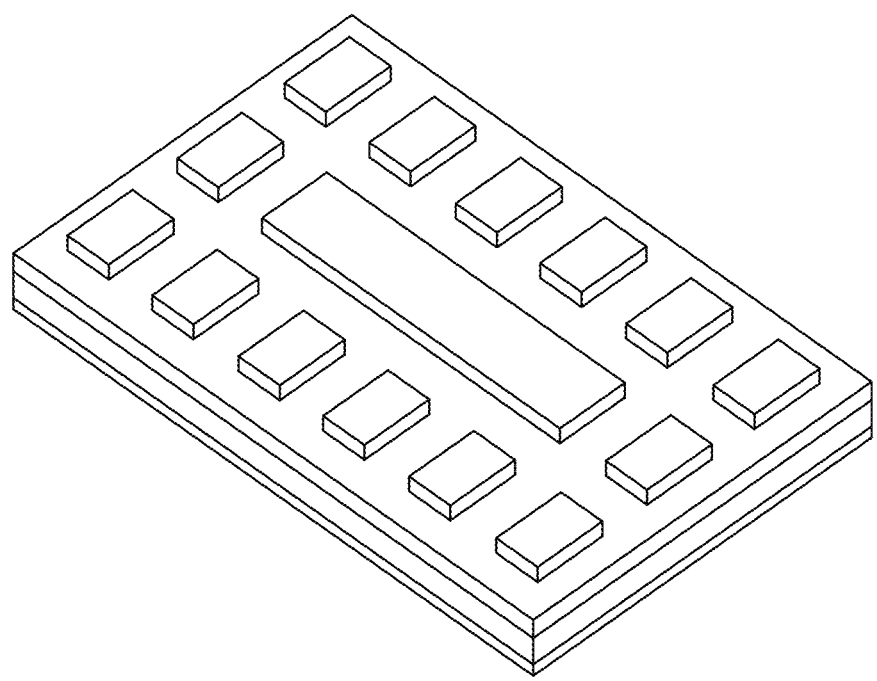
FIG. 7A illustrates a device package having a second example bond pad configuration.
Figure 7B:
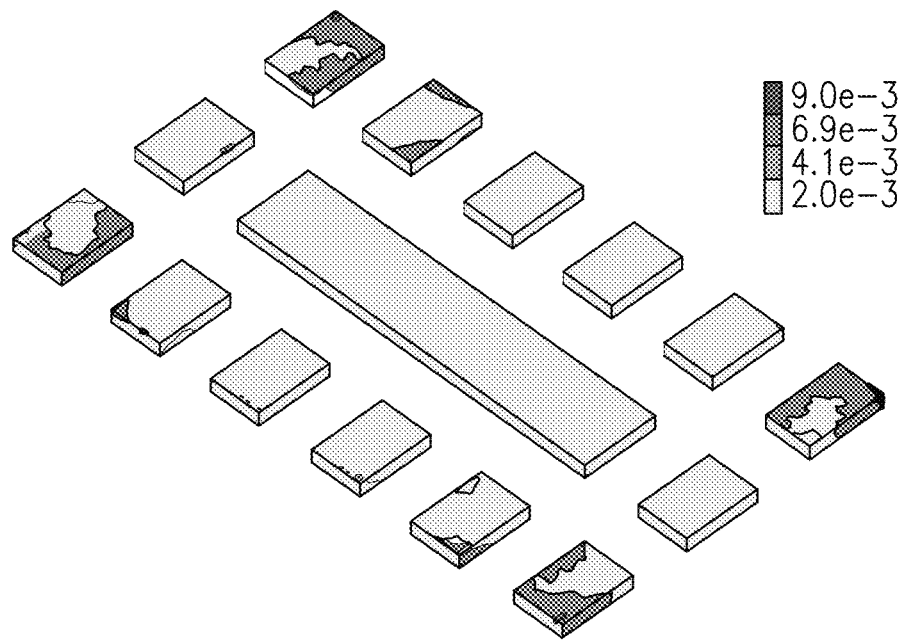
FIG. 7B illustrates the accumulated strain in the bond pads of the device of FIG. 7A predicted by simulation.

In a second example (Example 2), as illustrated in FIG. 7A, the four central ground terminals (solder pads 15-18 in FIG. 1) were unified into a single larger central ground solder pad with dimensions of approximately 130 μm by 30 μm and squared (90-degree) corners. The solder pads about the periphery of the device package were unchanged from Example 1. The inelastic strain distribution that was determined by the simulation is illustrated in FIG. 7B. The maximum inelastic strain value observed in Example 2 was reduced to $8.207 \times 10^{-3}$ as compared to the maximum inelastic strain value of $8.520 \times 10^{-3}$ observed in Example 1.

Figure 8A:
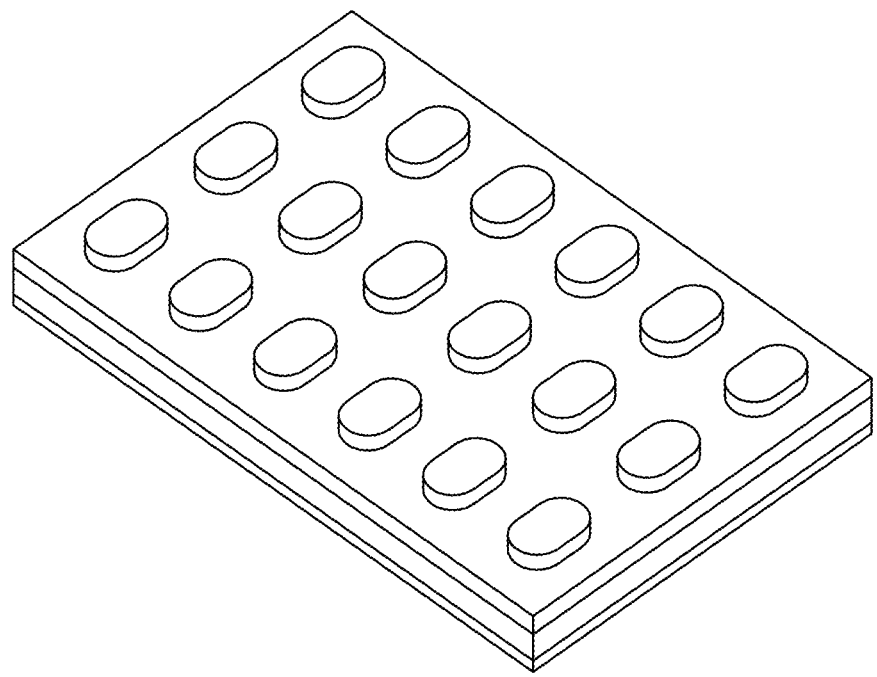
FIG. 8A illustrates a device package having a third example bond pad configuration.
Figure 8B:
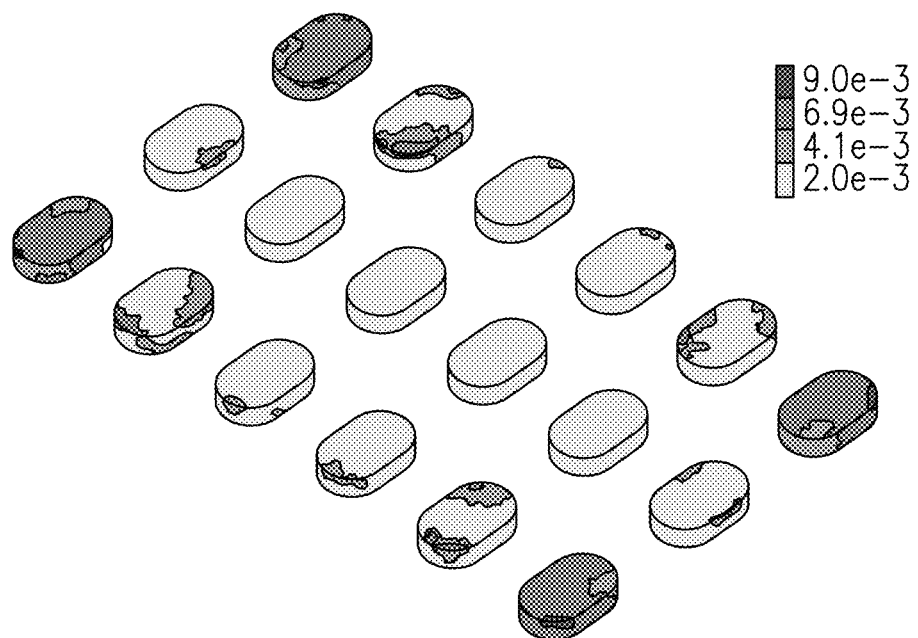
FIG. 8B illustrates the accumulated strain in the bond pads of the device of FIG. 8A predicted by simulation.

In a third example (Example 3), as illustrated in FIG. 8A, all solder pads were rounded. The inelastic strain distribution that was determined by the simulation is illustrated in FIG. 8B. The maximum inelastic strain value observed in Example 3 was reduced to $8.101 \times 10^{-3}$ as compared to the maximum inelastic strain value of $8.520 \times 10^{-3}$ observed in Example 1.

Figure 9A:
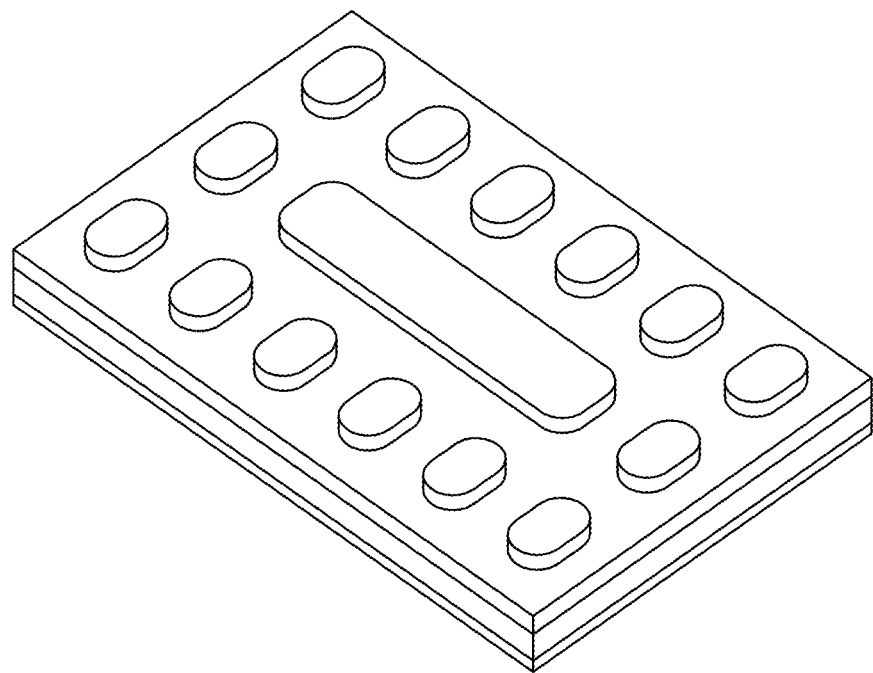
FIG. 9A illustrates a device package having a fourth example bond pad configuration.
Figure 9B:
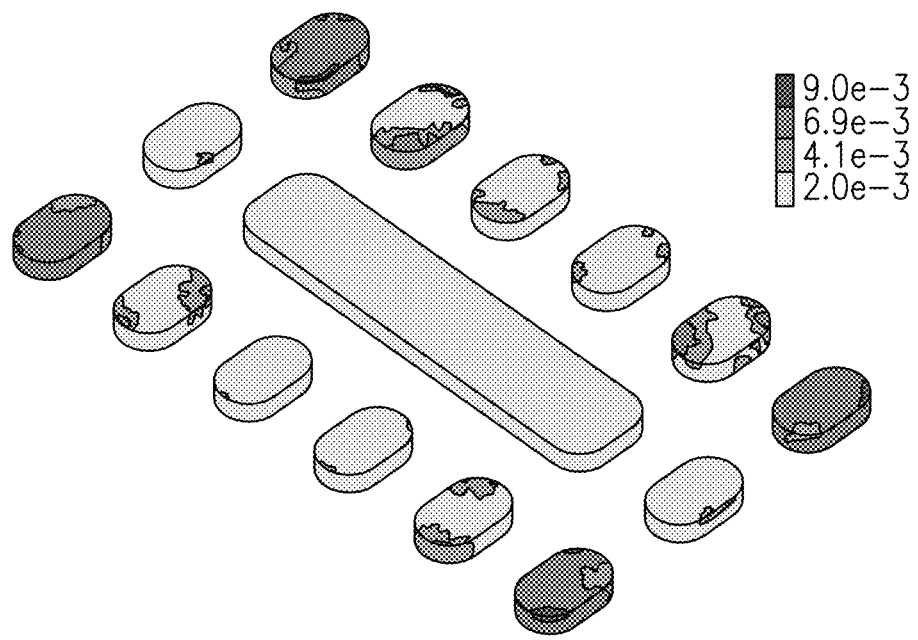
FIG. 9B illustrates the accumulated strain in the bond pads of the device of FIG. 9A predicted by simulation.

In a fourth example (Example 4), as illustrated in FIG. 9A, the four central ground terminals (solder pads 15-18 in FIG. 1) were unified into a single larger central ground solder pad with dimensions of approximately 130 μm by 30 μm. The central ground solder pad and all solder pads about the periphery of the device package were rounded. The inelastic strain distribution that was determined by the simulation is illustrated in FIG. 9B. The maximum inelastic strain value observed in Example 4 was reduced to $8.096 \times 10^{-3}$ as compared to the maximum inelastic strain value of $8.520 \times 10^{-3}$ observed in Example 1.

Figure 10A:
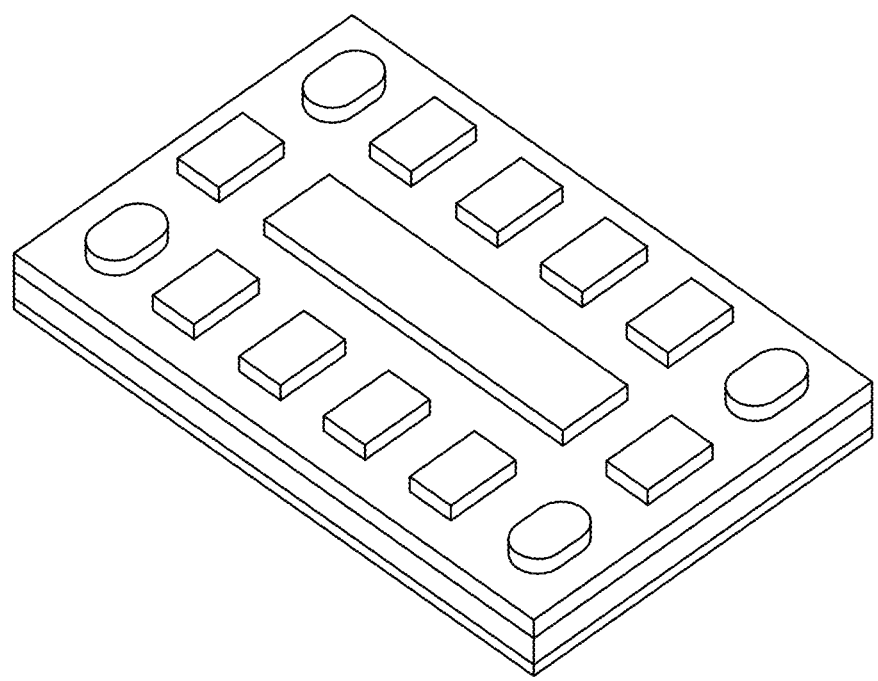
FIG. 10A illustrates a device package having a fifth example bond pad configuration.
Figure 10B:
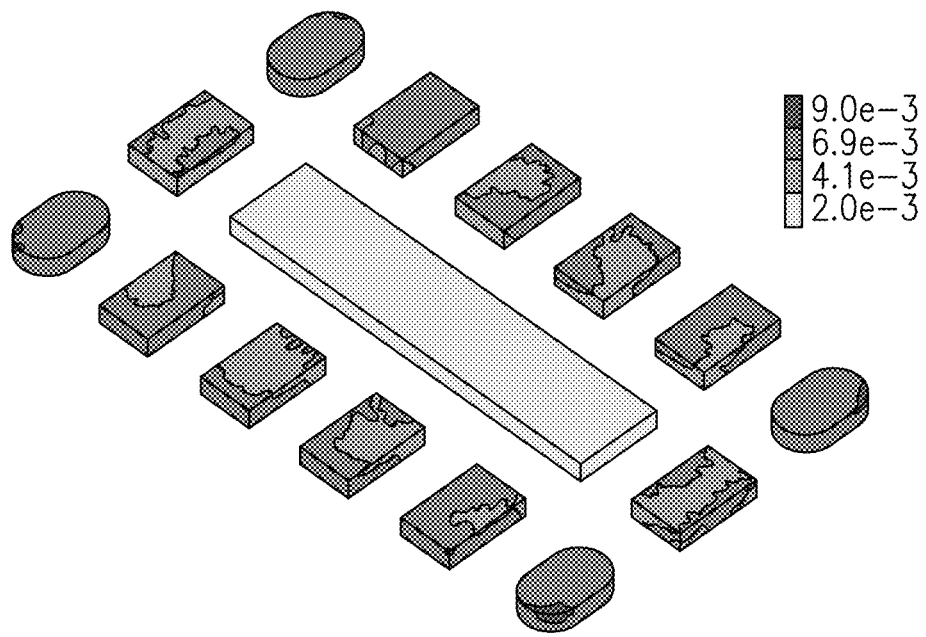
FIG. 10B illustrates the accumulated strain in the bond pads of the device of FIG. 10A predicted by simulation.

In a fifth example (Example 5), as illustrated in FIG. 10A, the four central ground terminals (solder pads 15-18 in FIG. 1) were unified into a single larger central ground solder pad with dimensions of approximately 130 μm by 30 μm and squared (90-degree) corners. The four corners of the solder pads at each corner the device package (solder pads 1, 6, 8, and 13 in FIG. 1) were rounded. The inelastic strain distribution that was determined by the simulation is illustrated in FIG. 10B. The maximum inelastic strain value observed in Example 5 was reduced to $8.078 \times 10^{-3}$ as compared to the maximum inelastic strain value of $8.520 \times 10^{-3}$ observed in Example 1.

Figure 11A:
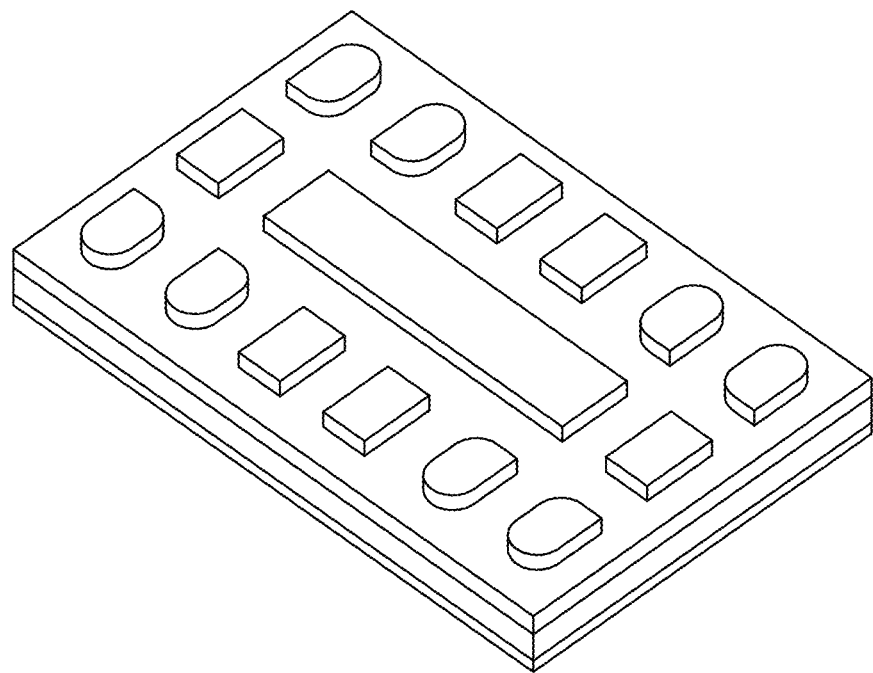
FIG. 11A illustrates a device package having a sixth example bond pad configuration.
Figure 11B:
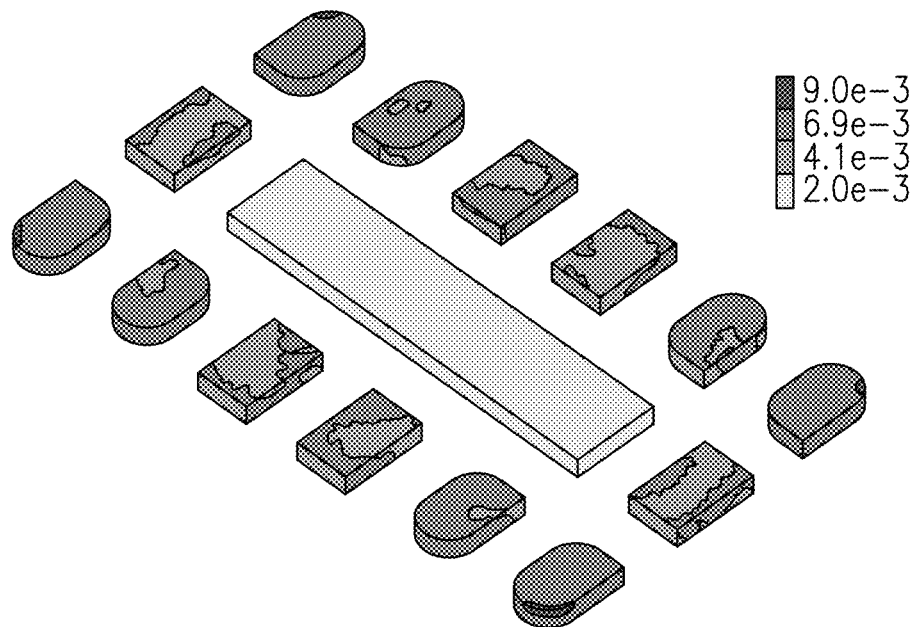
FIG. 11B illustrates the accumulated strain in the bond pads of the device of FIG. 11A predicted by simulation.

In a sixth example (Example 6), as illustrated in FIG. 11A, the four central ground terminals (solder pads 15-18 in FIG. 1) were unified into a single larger central ground solder pad with dimensions of approximately 130 μm by 30 μm and squared (90-degree) corners. Three of the four corners of the solder pads at each corner the device package (solder pads 1, 6, 8, and 13 in FIG. 1) were rounded while the most lengthwise (along the longer dimension of the device package) outward and widthwise (along the shorter dimension of the device package) inward corner of these pads was left with a 90-degree angle. The second most inward solder pads along the lengthwise dimension of the device (pads 2, 5, 9, and 12 in FIG. 1) were similarly changed to include three rounded corners and one squared corner. The inelastic strain distribution that was determined by the simulation is illustrated in FIG. 11B. The maximum inelastic strain value observed in Example 6 was reduced to $7.740 \times 10^{-3}$ as compared to the maximum inelastic strain value of $8.520 \times 10^{-3}$ observed in Example 1.

Figure 12A:
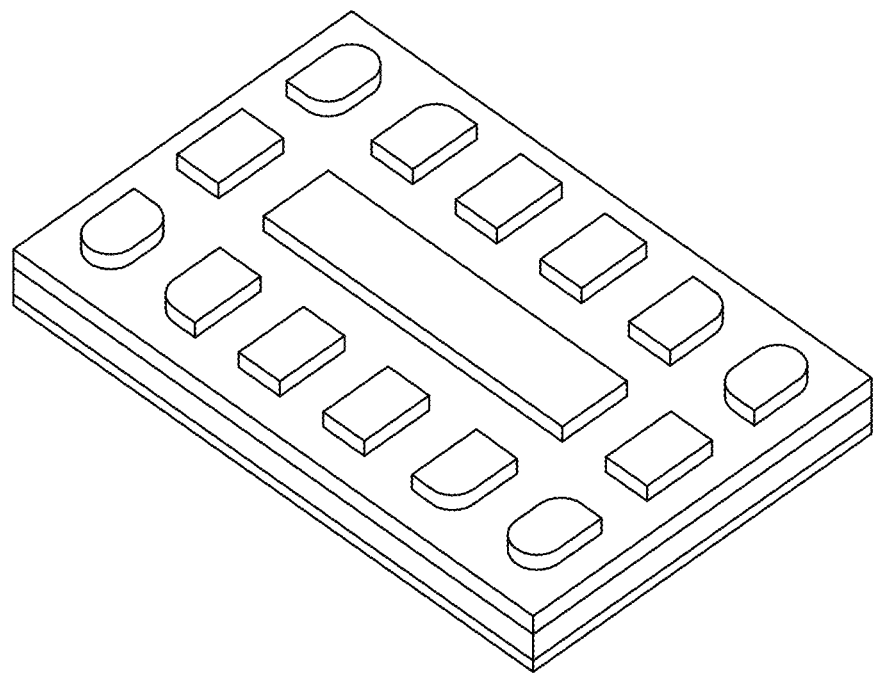
FIG. 12A illustrates a device package having a seventh example bond pad configuration.
Figure 12B:
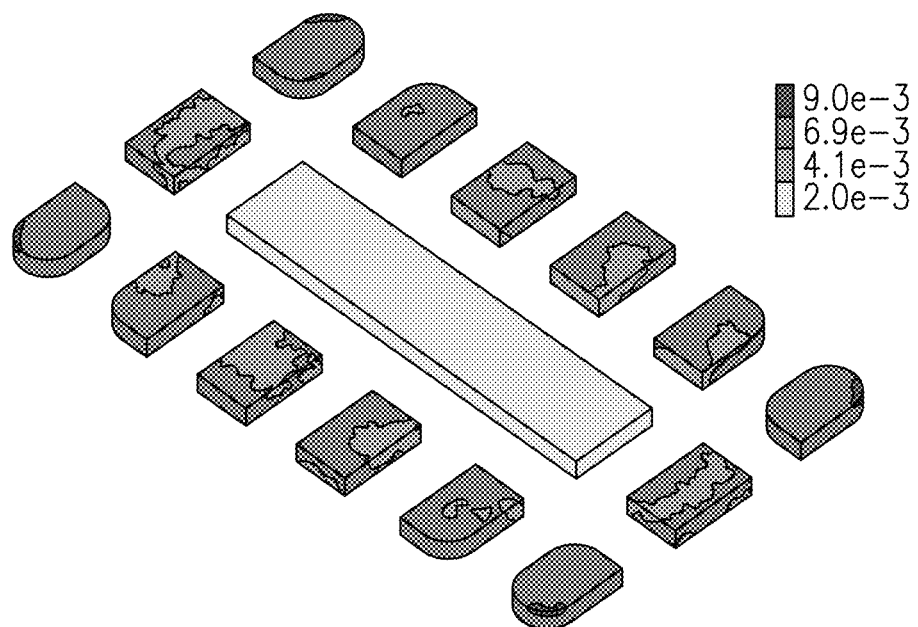
FIG. 12B illustrates the accumulated strain in the bond pads of the device of FIG. 12A predicted by simulation.

In a seventh example (Example 7), as illustrated in FIG. 12A, the four central ground terminals (solder pads 15-18 in FIG. 1) were unified into a single larger central ground solder pad with dimensions of approximately 130 μm by 30 μm and squared (90-degree) corners. Three of the four corners of the solder pads at each corner the device package (solder pads 1, 6, 8, and 13 in FIG. 1) were rounded while the most lengthwise (along the longer dimension of the device package) outward and widthwise (along the shorter dimension of the device package) inward corner of these pads was left with a 90-degree angle. The second most inward solder pads along the lengthwise dimension of the device (pads 2, 5, 9, and 12 in FIG. 1) had only the most lengthwise outward and most widthwise outward corner rounded while the other three corners were left squared. The inelastic strain distribution that was determined by the simulation is illustrated in FIG. 12B. The maximum inelastic strain value observed in Example 7 was reduced to $7.488 \times 10^{-3}$ as compared to the maximum inelastic strain value of $8.520 \times 10^{-3}$ observed in Example 1.

The maximum observed inelastic strain and the estimated remaining lifetime (in temperature cycles) calculated from the Coffin-Manson rule above are shown in Table 1 below:

TABLE 1

Simulation Results

| Example No. | Maximum inelastic strain amplitude in solder pads | Minimum inelastic strain amplitude in solder pads | Estimated remaining lifetime (cycles) |
|---|---|---|---|
| Example 1 (Baseline) | $8.520 \times 10^{-3}$ | $3.171 \times 10^{-5}$ | 1378 |
| Example 2 | $8.207 \times 10^{-3}$ | $9.456 \times 10^{-6}$ | 1485 |
| Example 3 | $8.101 \times 10^{-3}$ | $4.568 \times 10^{-5}$ | 1524 |
| Example 4 | $8.096 \times 10^{-3}$ | $8.833 \times 10^{-6}$ | 1526 |
| Example 5 | $8.078 \times 10^{-3}$ | $6.845 \times 10^{-6}$ | 1532 |
| Example 6 | $7.740 \times 10^{-3}$ | $7.929 \times 10^{-6}$ | 1669 |
| Example 7 | $7.488 \times 10^{-3}$ | $6.183 \times 10^{-6}$ | 1784 |

From these simulations, it can be seen that the best results (lowest inelastic strain, longest lifetime) were obtained by modifying the baseline example to combine the four central solder terminals into a single larger terminal with squared edges and by rounding three out of four of the corners of the solder pads at the corners of the device package and a single corner of the second terminals along the lengthwise direction of the device package.

Figure 13:
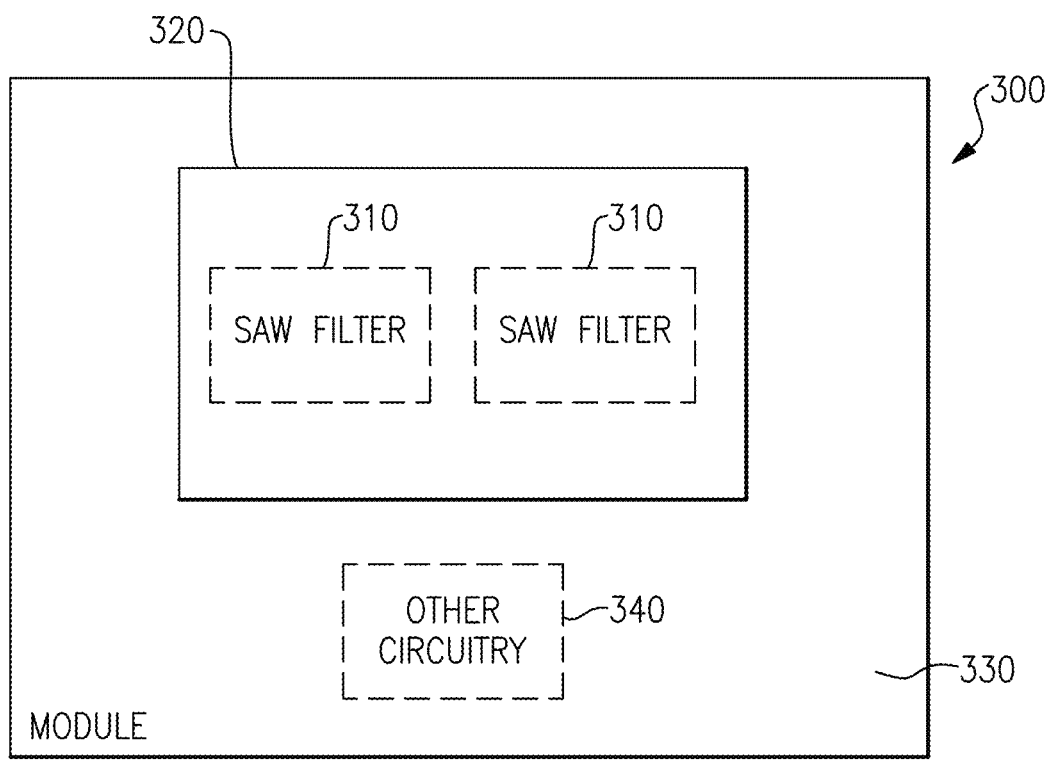
FIG. 13 is a block diagram of one example of a filter module that can include one or more surface acoustic wave elements according to aspects of the present disclosure.
Figure 14:
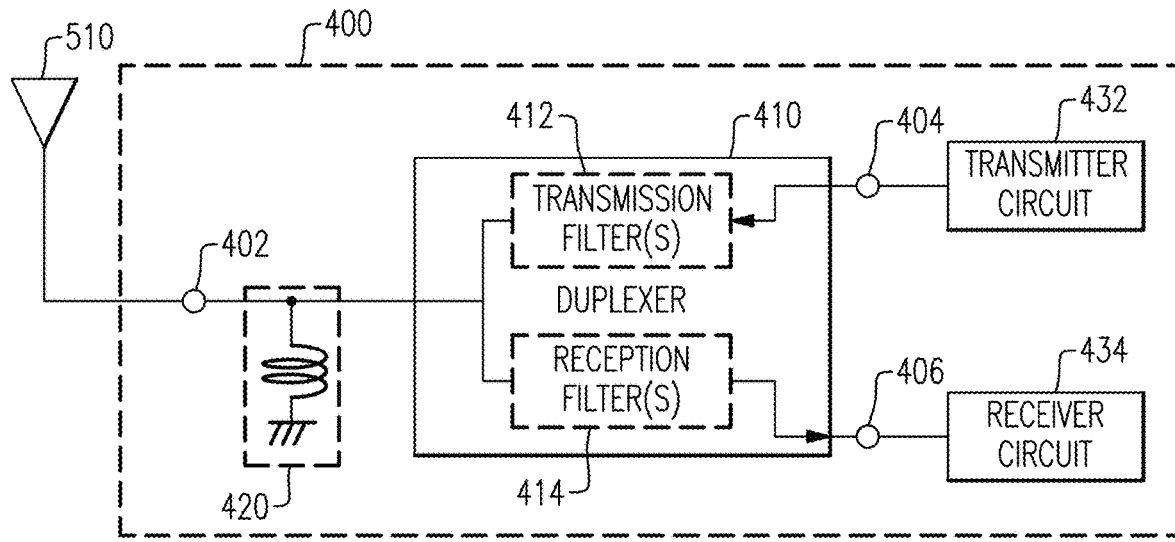
FIG. 14 is a block diagram of one example of a front-end module that can include one or more filter modules according to aspects of the present disclosure.
Figure 15:
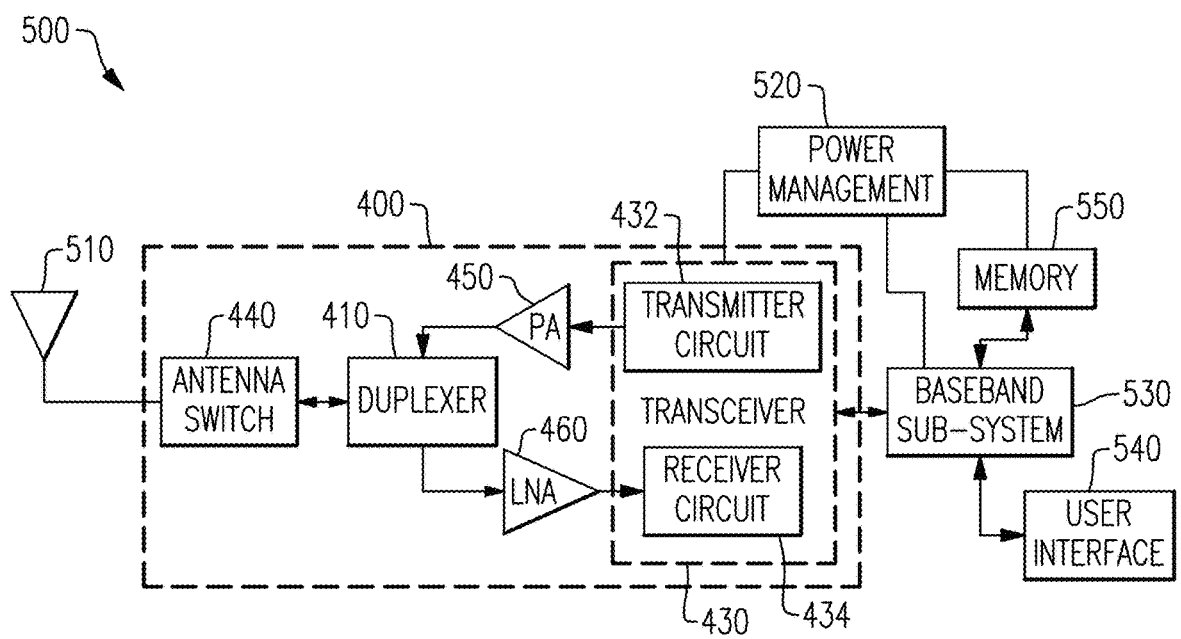
FIG. 15 is a block diagram of one example of a wireless device including the front-end module of FIG. 14.

Packages including surface acoustic wave devices and having bond pad configurations as discussed herein can be implemented in a variety of packaged modules. Some example packaged modules will now be discussed in which any suitable principles and advantages of the packaged acoustic wave devices discussed herein can be implemented. FIGS. 13, 14, and 15 are schematic block diagrams of illustrative packaged modules and devices according to certain embodiments.

As discussed above, embodiments of the surface acoustic wave elements can be configured as or used in filters, for example. In turn, a surface acoustic wave (SAW) filter using one or more SAW elements may be incorporated into and packaged as a module that may ultimately be used in an electronic device, such as a wireless communications device, for example. FIG. 13 is a block diagram illustrating one example of a module 300 including a one or more SAW filters 310. The one or more SAW filters 310 may be implemented on one or more die(s) 320. The packaged module 300 includes a packaging substrate 330 that is configured to receive a plurality of components, including the die 320. Die 320 may be bonded to the packaging substrate 330 utilizing bond pads configured as in any of the examples discussed herein. The module 300 may optionally further include other circuitry die 340, for example, one or more additional filter(s), amplifiers, pre-filters, modulators, demodulators, down converters, and the like, as would be known to one of skill in the art of semiconductor fabrication in view of the disclosure herein. In some embodiments, the module 300 can also include one or more packaging structures to, for example, provide protection and facilitate easier handling of the module 300. Such a packaging structure can include an overmold formed over the packaging substrate 330 and dimensioned to substantially encapsulate the various circuits and components thereon.

Various examples and embodiments of the SAW filters 310 can be used in a wide variety of electronic devices. For example, the SAW filters 310 can be used in an antenna duplexer, which itself can be incorporated into a variety of electronic devices, such as RF front-end modules and communication devices.

Referring to FIG. 14, there is illustrated a block diagram of one example of a front-end module 400, which may be used in an electronic device such as a wireless communications device (e.g., a mobile phone) for example. The front-end module 400 includes an antenna duplexer 410 having a common node 402, an input node 404, and an output node 406. An antenna 510 is connected to the common node 402.

The antenna duplexer 410 may include one or more transmission filters 412 connected between the input node 404 and the common node 402, and one or more reception filters 414 connected between the common node 402 and the output node 406. The passband(s) of the transmission filter(s) are different from the passband(s) of the reception filters. Examples of the SAW filters 310 can be used to form the transmission filter(s) 412 and/or the reception filter(s) 414. An inductor or other matching component 420 may be connected at the common node 402.

The front-end module 400 further includes a transmitter circuit 432 connected to the input node 404 of the duplexer 410 and a receiver circuit 434 connected to the output node 406 of the duplexer 410. The transmitter circuit 432 can generate signals for transmission via the antenna 510, and the receiver circuit 434 can receive and process signals received via the antenna 510. In some embodiments, the receiver and transmitter circuits are implemented as separate components, as shown in FIG. 14, however in other embodiments these components may be integrated into a common transceiver circuit or module. As will be appreciated by those skilled in the art, the front-end module 400 may include other components that are not illustrated in FIG. 14 including, but not limited to, switches, electromagnetic couplers, amplifiers, processors, and the like.

FIG. 15 is a block diagram of one example of a wireless device 500 including the antenna duplexer 410 shown in FIG. 14. The wireless device 500 can be a cellular phone, smart phone, tablet, modem, communication network or any other portable or non-portable device configured for voice or data communication. The wireless device 500 can receive and transmit signals from the antenna 510. The wireless device includes an embodiment of a front-end module 400 similar to that discussed above with reference to FIG. 14. The front-end module 400 includes the duplexer 410, as discussed above. In the example shown in FIG. 15 the front-end module 400 further includes an antenna switch 440, which can be configured to switch between different frequency bands or modes, such as transmit and receive modes, for example. In the example illustrated in FIG. 15, the antenna switch 440 is positioned between the duplexer 410 and the antenna 510; however, in other examples the duplexer 410 can be positioned between the antenna switch 440 and the antenna 510. In other examples the antenna switch 440 and the duplexer 410 can be integrated into a single component.

The front-end module 400 includes a transceiver 430 that is configured to generate signals for transmission or to process received signals. The transceiver 430 can include the transmitter circuit 432, which can be connected to the input node 404 of the duplexer 410, and the receiver circuit 434, which can be connected to the output node 406 of the duplexer 410, as shown in the example of FIG. 14.

Signals generated for transmission by the transmitter circuit 432 are received by a power amplifier (PA) module 450, which amplifies the generated signals from the transceiver 430. The power amplifier module 450 can include one or more power amplifiers. The power amplifier module 450 can be used to amplify a wide variety of RF or other frequency-band transmission signals. For example, the power amplifier module 450 can receive an enable signal that can be used to pulse the output of the power amplifier to aid in transmitting a wireless local area network (WLAN) signal or any other suitable pulsed signal. The power amplifier module 450 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 450 and associated components including switches and the like can be fabricated on gallium arsenide (GaAs) substrates using, for example, high-electron mobility transistors (pHEMT) or insulated-gate bipolar transistors (BiFET), or on a silicon substrate using complementary metal-oxide semiconductor (CMOS) field effect transistors.

Still referring to FIG. 15, the front-end module 400 may further include a low noise amplifier module 460, which amplifies received signals from the antenna 510 and provides the amplified signals to the receiver circuit 434 of the transceiver 430.

The wireless device 500 of FIG. 15 further includes a power management system 520 that is connected to the transceiver 430 and manages the power for the operation of the wireless device 500. The power management system 520 can also control the operation of a baseband sub-system 530 and various other components of the wireless device 500. The power management system 520 can include, or can be connected to, a battery (not shown) that supplies power for the various components of the wireless device 500. The power management system 520 can further include one or more processors or controllers that can control the transmission of signals, for example. In one embodiment, the baseband sub-system 530 is connected to a user interface 540 to facilitate various input and output of voice and/or data provided to and received from the user. The baseband sub-system 530 can also be connected to memory 550 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An electronic device package comprising:
   a lower surface for conducting electronic signals;
   a first solder bond pad disposed on the lower surface; and
   a plurality of second solder bond pads disposed on the lower surface and surrounding the first solder bond pad, each of the plurality of second solder bond pads having at least one rounded corner and a squared corner, the plurality of second solder bond pads including four corner solder bond pads disposed proximate respective corners of the lower surface of the electronic device package, the four corner solder bond pads each having three rounded corners and one squared corner.

2. The electronic device package of claim 1 wherein a length of the first solder bond pad is greater than lengths of each of the plurality of second solder bond pads.

3. The electronic device package of claim 1 wherein the squared corner of each of the four corner solder bond pads is on a side of each of the four corner solder bond pads facing away from the first solder bond pad in a lengthwise direction and facing toward the first solder bond pad in a widthwise direction.

4. The electronic device package of claim 1 wherein the plurality of second solder bond pads includes four third solder bond pads, each of the four third solder bond pads disposed adjacent a respective one of the four corner solder bond pads in a lengthwise direction on the lower surface of the electronic device package.

5. The electronic device package of claim 4 wherein the four third solder bond pads each have three squared corners and one rounded corner.

6. The electronic device package of claim 5 wherein the rounded corner of each of the four third solder bond pads faces away from the first solder bond pad and toward the respective corner solder bond pad to which each respective third solder bond pad is disposed adjacent to.

7. The electronic device package of claim 6 further comprising fourth bond pads disposed between two of the third bond pads and having four squared corners.

8. The electronic device package of claim 1 wherein the first solder bond pad has four squared corners.

9. The electronic device package of claim 8 wherein the first solder bond pad is rectangular.

10. The electronic device package of claim 1 wherein the first solder bond pad is disposed centrally on the lower surface of the electronic device package.

11. The electronic device package of claim 1 wherein the first solder bond pad is a ground bond pad.

12. The electronic device package of claim 1 wherein the plurality of second solder bond pads are each smaller than the first solder bond pad.

13. An electronic device comprising:
a plurality of acoustic wave resonators disposed in an electronic device package, the electronic device package including:
a lower surface for conducting electronic signals;
a first solder bond pad disposed on the lower surface; and
a plurality of second solder bond pads disposed on the lower surface and surrounding the first solder bond pad, each of the plurality of second solder bond pads including at least one rounded corner and a squared corner, the plurality of second solder bond pads including four corner solder bond pads disposed proximate respective corners of the lower surface of the electronic device package, the four corner solder bond pads each having three rounded corners and one squared corner.

14. The electronic device of claim 13 wherein the plurality of second solder bond pads includes four third solder bond pads, each of the four third solder bond pads disposed adjacent a respective one of the four corner solder bond pads in a lengthwise direction on the lower surface of the electronic device package, the four third solder bond pads each having three squared corners and one rounded corner.

15. The electronic device package of claim 14 wherein the rounded corner of each of the four third solder bond pads faces away from the first solder bond pad and toward the respective corner solder bond pad to which each respective third solder bond pad is disposed adjacent to.

16. The electronic device package of claim 14 further comprising fourth solder bond pads disposed between two of the third solder bond pads and having four squared corners.

17. An electronic device package comprising:
a lower surface for conducting electronic signals;
a first solder bond pad disposed on the lower surface; and
a plurality of second solder bond pads disposed on the lower surface and surrounding the first solder bond pad, each of the plurality of second solder bond pads having at least three rounded corners, the plurality of second solder bond pads including four corner solder bond pads disposed proximate respective corners of the lower surface of the electronic device package, the four corner solder bond pads each having three rounded corners and one squared corner.

18. The electronic device package of claim 17 wherein the plurality of second solder bond pads are each smaller than the first solder bond pad.

\* \* \* \* \*